United States Patent [19]
Kohno

[11] Patent Number: 5,617,355
[45] Date of Patent: Apr. 1, 1997

[54] SEMICONDUCTOR MEMORY DEVICE HAVING POSITIVE FEEDBACK SENSE AMPLIFIER

[75] Inventor: Takaki Kohno, Tokyo, Japan

[73] Assignee: NEC Corporation, Tokyo, Japan

[21] Appl. No.: 588,372

[22] Filed: Jan. 18, 1996

[30] Foreign Application Priority Data

Jan. 20, 1995 [JP] Japan ................................. 7-026177

[51] Int. Cl.$^6$ ............................. G11C 11/34; G11C 7/02
[52] U.S. Cl. ...................... 365/185.21; 365/207; 365/208
[58] Field of Search ............................ 365/185.21, 207, 365/208; 327/51

[56] References Cited

U.S. PATENT DOCUMENTS

| | | | |
|---|---|---|---|
| 5,126,974 | 6/1992 | Sasaki et al. | 365/207 |
| 5,479,374 | 12/1995 | Kobayashi et al. | 365/207 |
| 5,528,544 | 6/1996 | Kohno | 365/208 |

FOREIGN PATENT DOCUMENTS

| | | | |
|---|---|---|---|
| 63-81687 | 4/1988 | Japan | 365/208 |
| 4-368173 | 12/1992 | Japan. | |

OTHER PUBLICATIONS

S. Tanaka et al., "A Programmable 256K CMOS EPROM with On–Chip Test Circuits", *IEEE International Solid-State Circuits Conference,* Feb. 23, 1984, pp. 148–149.

*Primary Examiner*—David C. Nelms
*Assistant Examiner*—Trong Quang Phan
*Attorney, Agent, or Firm*—Sughrue, Mion, Zinn, Macpeak & Seas

[57] ABSTRACT

In a semiconductor memory device including ROM cells, a digit line for receiving read data from a selected one of the at the memory cells, and a bias circuit for amplifying a voltage at the digit line, a differential amplifier, which has a positive phase input, a negative phase input, a positive phase output and a negative phase output, is provided. The positive phase input is connected to the output of the bias circuit. The negative phase output is connected to the negative phase input, thereby establishing a positive feedback loop in the differential amplifier.

11 Claims, 10 Drawing Sheets

SEMICONDUCTOR MEMORY DEVICE HAVING POSITIVE FEEDBACK SENSE AMPLIFIER

BACKGROUND OF THE INVENTION

1. Field of the Invention

The present invention relates to a semiconductor memory device including read-only memory (ROM) cells, and more particularly, to the improvement of a sense amplifier in a semiconductor memory device.

2. Description of the Related Art

ROM devices are broadly divided into a nonvolatile ROM device such as an erasable programmable ROM (EPROM) device and an electrically erasable programmable ROM (EEPROM) device, and a mask ROM device.

In an EPROM device or an EEPROM device, binary data "0" or "1" corresponds to the low or high threshold voltage of a transistor, which is determined by introducing carriers (electrons) into a floating gate by a tunnel effect.

Similarly, in a mask ROM device, binary data "0" or "1" of a memory cell corresponds to:

the presense or absense of an enhancement type transistor;

the low or high threshold voltage of a transistor;

the depletion type or enhancement type of a transistor; or the presense or absense of a contact window (through-hole) which connects a transistor to one bit line.

A typical ROM device includes a memory cell array formed by ROM memory cells, a digit line for receiving read data from a selected one of the ROM memory cells, a sense amplifier for sensing a voltage at the digit line to generate a sense voltage signal, and an output buffer for outputting an output signal in response to the sense voltage signal.

A prior art sense amplifier includes a bias circuit for amplifying the voltage at the digit line, a reference voltage generating circuit for generating a reference voltage signal, and a differential amplifier for amplifying the difference in potential between the output signal of the bias circuit and the reference voltage signal (see: S. Tanaka et al., "A Programmable 256K CMOS EPROM with On-Chip Test Circuits", IEEE International Solid-State Circuits Conference, pp. 148–149, 1984). This will be explained later in detail.

In the above-described prior art sense amplifier, however, one reference voltage generating circuit is provided for each sense amplifier. If the number of sense amplifiers is increased, the integration is reduced, and also, the power dissipation is increased due to the current flowing through the reference voltage generating circuits.

SUMMARY OF THE INVENTION

It is an object of the present invention to provide a ROM device capable of enhanced integration and reduced power dissipation.

According to the present invention, in a semiconductor memory device including ROM cells, a digit line for receiving read data from a selected one of the memory cells, and a bias circuit for amplifying a voltage at the digit line, a differential amplifier, which has a positive phase input, a negative phase input, a positive phase output and a negative phase output, is provided. The positive phase input is connected to the output of the bias circuit. The negative phase output is connected to the negative phase input, thereby establishing a positive feedback loop in the differential amplifier.

Since no reference voltage generating circuit is provided in a sense amplifier, the integration can be enhanced and the power dissipation can be reduced.

BRIEF DESCRIPTION OF THE DRAWINGS

The present invention will be clearly understood from the description as set forth below, as compared with the prior art, with reference to the accompanying drawings, wherein.

DESCRIPTION OF THE PREFERRED EMBODIMENTS

Before the description of the preferred embodiments, prior art ROM devices will be explained with reference to FIGS. 1 and 2.

Figure 1:
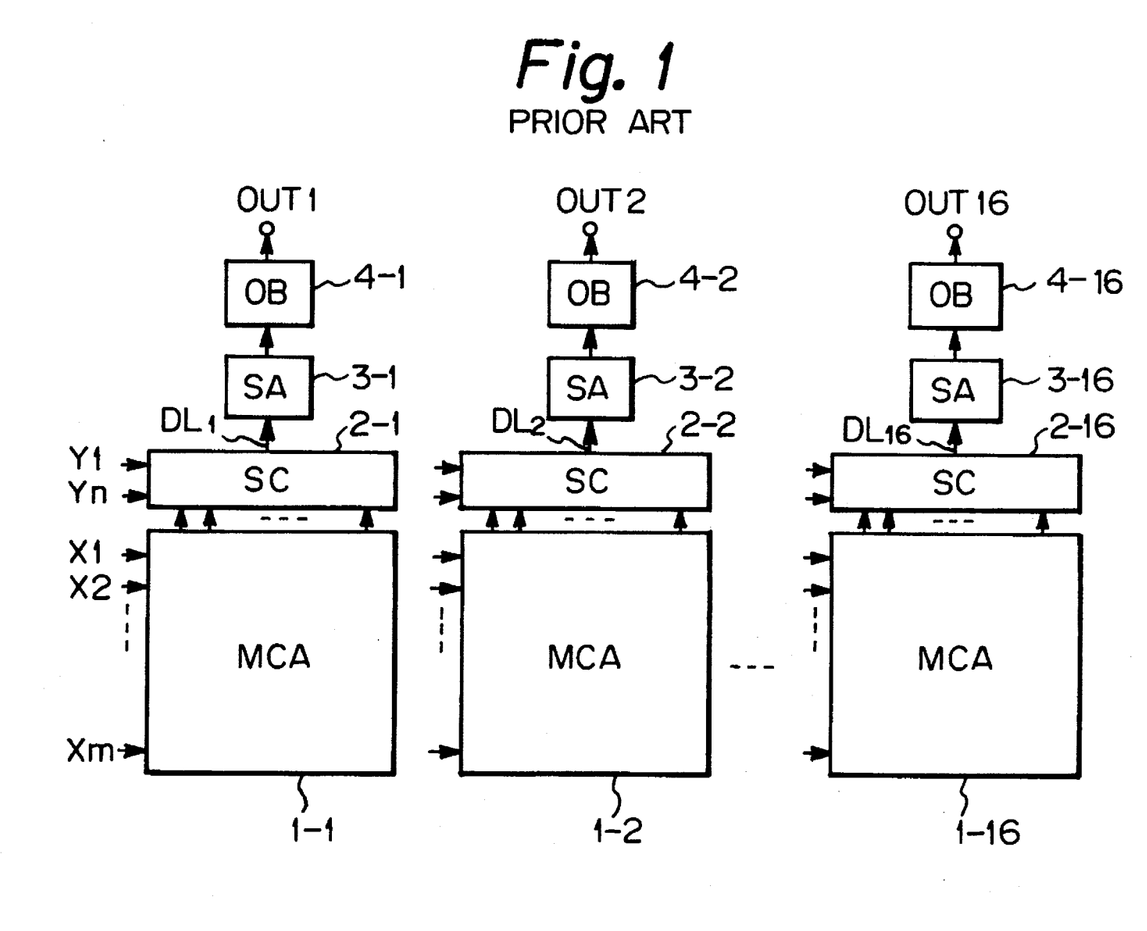
FIG. 1 is a block circuit diagram illustrating a prior art ROM device.

In FIG. 1, which illustrates a prior art ROM device (see the above-mentioned document), reference numerals 1-1 to 1-16 designate memory cell arrays which receive X address signals X1, X2, ..., Xm. Also, reference numerals 2-1, 2-2, ..., 2-16 designate Y switching circuits which receive Y address signals Y1, Y2, ..., Yn. Each of the Y switching circuits 2-1, 2-1, ..., 2-16 is connected between one of the memory cell arrays 1-1, 1-2, ..., 1-16 and one sense amplifier such as 3-1 which is also connected to an output buffer 4-1 connected to an output terminal OUT1.

The memory cell array 1-1, the Y switching circuit 2-1, the sense amplifier 3-1 and the output buffer 4-1 are explained next with reference to FIG. 2.

Figure 2:
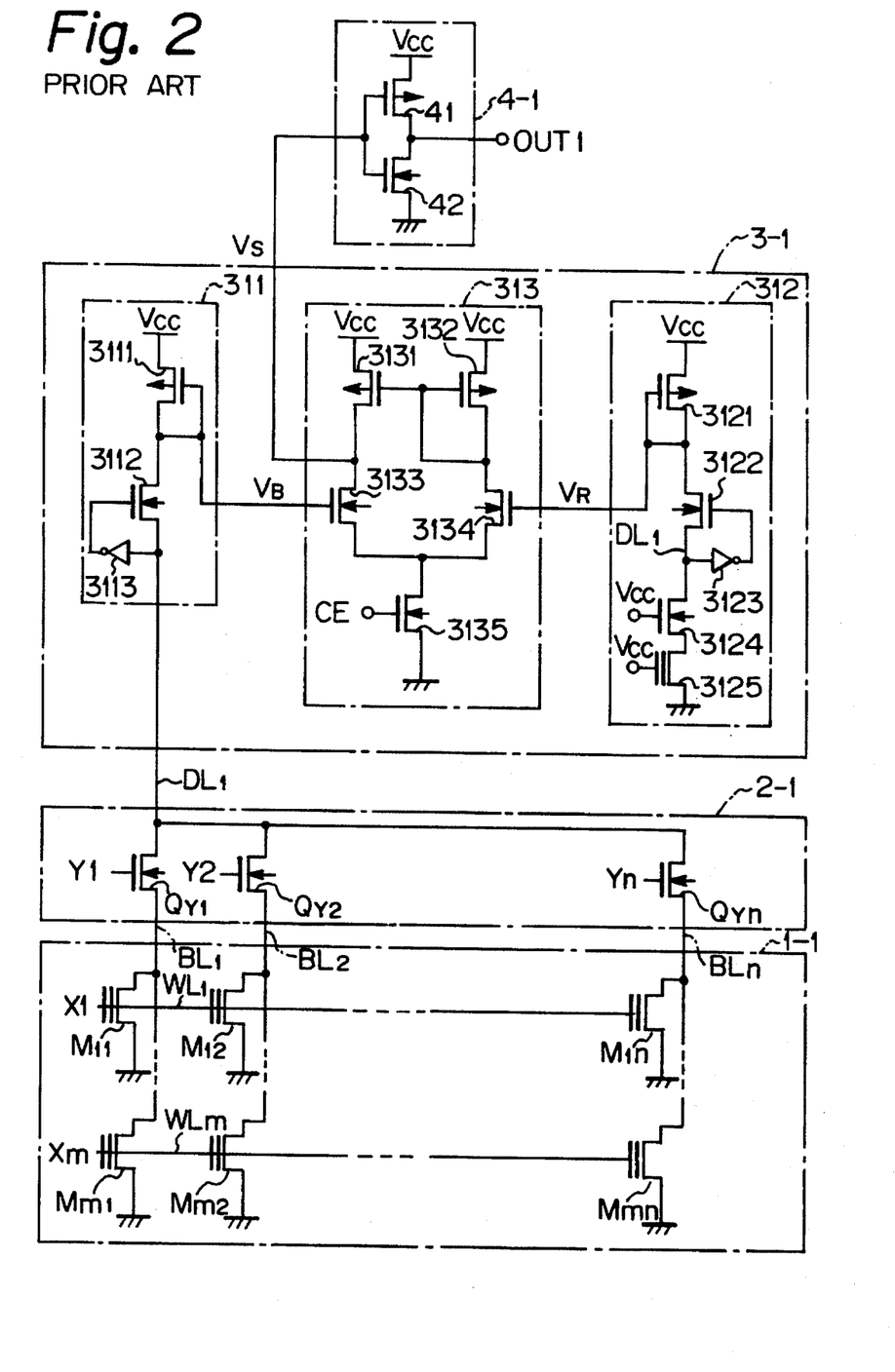
FIG. 2 is a detailed circuit diagram of the prior art ROM device of FIG. 1.

In FIG. 2, the memory cell array 1-1 is formed by nonvolatile memory cells $M_{11}$, $M_{12}$, ..., $M_{1_n}$, ..., $M_m^1$, $M_m^2$, ..., $M_{mn}$ each having a source connected to the ground GND, a drain connected to one of bit lines $BL_1$, $BL_2$, ..., $BL_n$, a floating gate, and a control gate connected to one of word lines $WL_1$, ..., $WL_m$. For example, a threshold voltage of one cell is 1 V for data "1" and a threshold voltage of one cell is 7 V for data "0".

The bit lines $BL_1$, ..., $BL_m$ are connected via column selection transistors (N-channel enhancement type MOS transistors) QY1, QY2, ..., QYn of the Y switching circuit 2-1 to a digit line $DL_1$. One of X address signals X1, ..., Xm is made high by a row decoder (not shown), and therefore, one of the word lines $WL_1$, ..., $WL_m$ is selected. In this case, the voltage at a selected word line is 5 V and the voltage at not-selected word lines is 0V. Similarly, one of Y address signals Y1, Y2, ..., Yn is made high by a column decoder (not shown), and therefore, one of the bit lines $BL_1$, $BL_2$, ..., $BL_n$, is selected and is connected to the digit line $DL_1$. Thus, data is read from a selected memory cell to the digit line $DL_1$.

Note that the nonvolatile memory cells $M_{11}$, $M_{12}$, ..., $M_{1_m}$, ..., $M_m^1$, $M_m^2$, ..., $M_{mn}$ are generally highly-fined. Therefore, current flowing through a selected memory cell having data "1" is very small, for example, about 10 μA, which invites a reduction of only tens of mV at the digit line $DL_1$. Therefore, the sense amplifier 3-1 is provided to sense such a small voltage.

The sense amplifier 3-1 includes a bias circuit 311, a reference voltage generating circuit 312, and a differential amplifier 313 for amplifying the difference in potential between the outputs of the bias circuit 311 and the reference voltage generating circuit 312.

The bias circuit 311 is formed by a P-channel MOS transistor 3111, an N-channel MOS transistor 3112, and an inverter 3113. As a result, the voltage at the digit line $DL_1$ is biased at around 1.2 V which is a threshold voltage of the inverter 3113. In more detail, when a selected memory cell stores data "0", the voltage at the digit line $DL_1$ is 1.21 V, for example. As a result, the transistor 3112 is turned OFF, so that the output voltage $V_B$ of the bias circuit 311 is increased to $V_{cc}-|V_{thp}|$ where $V_{thp}$ is a threshold voltage of the P-channel MOS transistor 3111. Conversely, when a selected memory cell stores data "1", the voltage at the digit line $DL_1$ is 1.20 V, for example. As a result, the transistor 3112 is turned ON, so that the output voltage $V_B$ of the bias circuit 311 is increased to $V_{cc}-|V_{thp}|-\alpha$ where $\alpha$ is determined by the voltage-to-current characteristics of the transistor 3111 and the voltage-to-current characteristics of an ON state memory cell, and is about 1 V.

Thus, in the bias circuit 311, the output voltage $V_B$ is 4 V and 3 V for data "1" and "0", respectively The reference voltage generating circuit 312 is formed by a P-channel MOS transistor 3121, an N-channel MOS transistor 3122, and an inverter 3123, in the same way as in the bias circuit 311. Also, the reference voltage generating circuit 312 includes an ON-state N-channel MOS transistor 3124 serving as a column selection transistor, and an ON-state nonvolatile memory cell 3125. In this case, the width of the nonvolatile memory cell 3125 is about one half of that of the memory cells $M_{11}$, $M_{12}$, ... As a result, the voltage at a reference digit line $DL_{1_R}$ is biased at an intermediate level between 1.20 V and 1.21 V.

Thus, in the reference voltage generating circuit 312, the reference voltage $V_R$ is always about 3.5 V.

The differential amplifier 313 includes two p-channel MOS transistors 3131 and 3132 which form a mirror current circuit, two N-channel MOS transistors 3133 and 3134 which receive the output voltage $V_B$ of the bias circuit 311 and the reference voltage $V_R$ of the reference voltage generating circuit 312, respectively, and an N-channel MOS transistor 3135 for receiving a chip enable signal CE. The differential amplifier 313 is powered by turning ON the transistor 3135 with the chip enable signal CE. For example, when $V_B > V_R$, the sense voltage $V_S$ of the sense amplifier 3-1 is low. Conversely, when $V_B < V_R$, the sense voltage $V_S$ of the sense amplifier 3-1 is high.

Further, the output buffer 4-1 is of a CMOS type formed by a P-channel MOS transistor 41 and an N-channel MOS transistor 42.

In FIG. 2, however, one reference voltage generating circuit is provided for each sense amplifier. Therefore, if the number of sense amplifiers is 16 as in the ROM device of FIG. 1, the integration is reduced, and also, the power dissipation is increased due to the current flowing through the reference voltage generating circuits.

Figure 3:
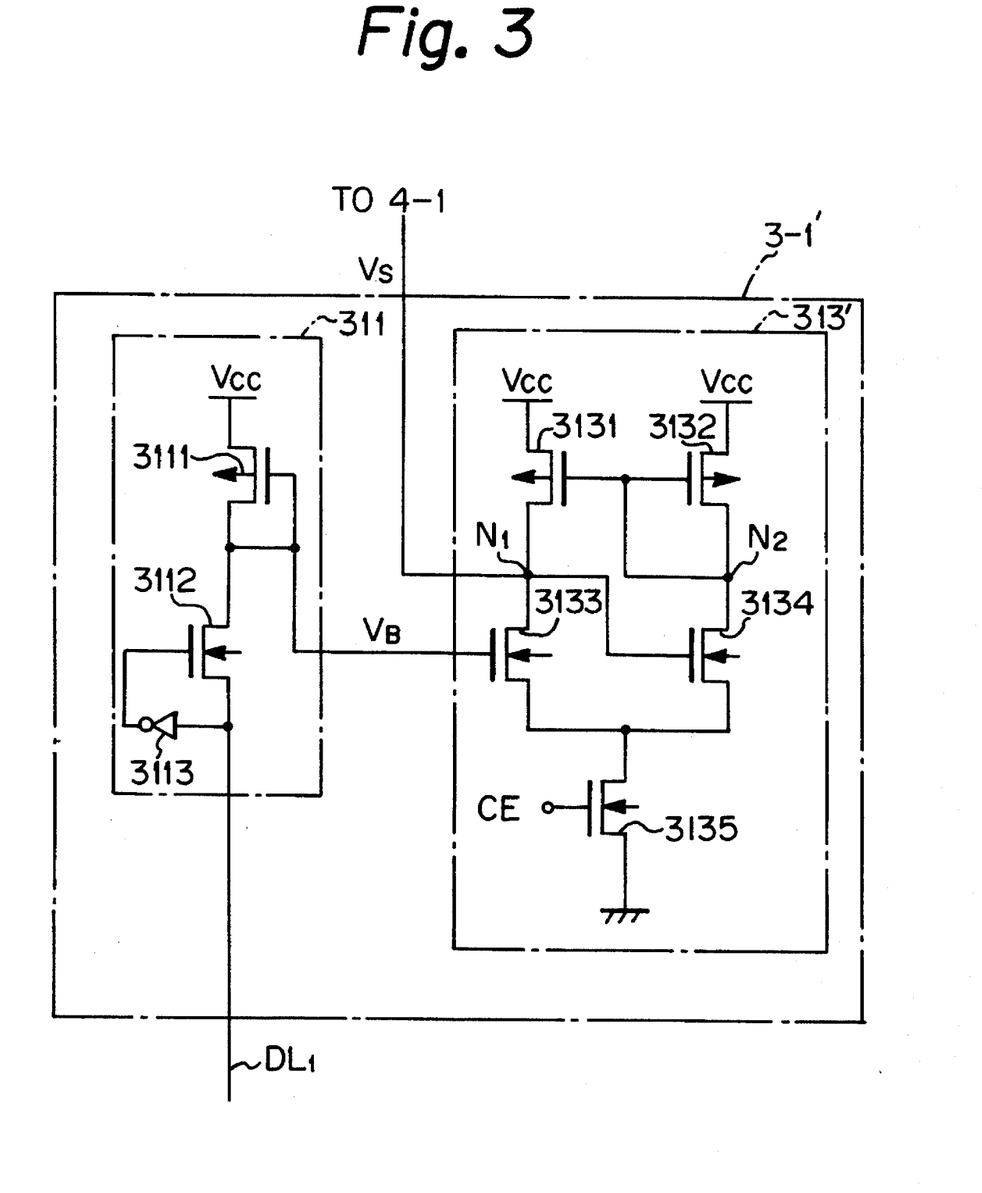
FIG. 3 is a circuit diagram illustrating a first embodiment of the sense amplifier according to the present invention.

In FIG. 3, which illustrates a first embodiment of the present invertion, in a sense amplifier 3-1', the reference voltage generating circuit 312 of FIG. 2 is deleted, and a positive feedback loop is provided within a differential amplifier 313'. In this case, assume that the gates of the transistors 3133 and 3134 are a positive phase input and a negative phase input, respectively, of the differential amplifier 313, and output nodes $N_1$ and $N_2$ are a negative phase output and a positive phase output, respectively, of the differential amplifier 313. Then, the negative phase input, i.e., the gate of the transistor 3134 is connected to the negative phase output $N_1$, thus realizing a positive feedback loop in the differential amplifier 313'.

The operation of the differential amplifier 313' of FIG. 3 is explained below. Note that, in this case, the transistor 3135 is always turned ON by the chip enable signal CE.

When the output voltage $V_B$ of the bias circuit 311 is high, the current capability of the N-channel transistor 3133 is increased so as to decrease the voltage at the node $N_1$. As a result, the current ability of the N-channel transistor 3134 is decreased so as to increase the voltage at the node $N_2$. Thus, the current capability of the P-channel transistor 3131 is decreased, so that the voltage at the node $N_1$ is decreased. In this case, due to the positive feedback loop between the node $N_1$ and the gate of the N-channel transistor 3134, the tower the voltage at the node $N_1$, the higher the voltage at the node $N_2$.

On the other hand, when the output voltage $V_B$ of the bias circuit 311 is low, the current capability of the N-channel transistor 3133 is decreased so as to increase the voltage at the node $N_1$. As a result, the current capability of the N-channel transistor 3134 is increased so as to decrease the voltage at the node $N_2$. Thus the current capability of the P-channel transistor 3131 is increased, so that the voltage at the node $N_1$ is increased. In this case, also due to the positive feedback loop between the node $N_1$ and the gate of the N-channel transistor 3134, the higher the voltage at the node $N_1$, the lower the voltage at the node $N_2$.

Thus, in FIG. 3, the voltage at the node $N_1$ which is changed in response to the output voltage $V_B$ of the bias circuit 311 is compared with the voltage at the node $N_2$.

Since the sense amplifier 3-1' is not provided with the reference voltage generating circuit 312 of FIG. 2, the sense amplifier 3-1' is remarkably reduced in size as compared with the sense amplifier 3-1 of FIG. 2. For example, the transistors 3111, 3121 and 3135 are 10 μm wide, the transistors 3112 and 3132 are 20 μm wide, and the transistors 3131, 3132, and 3134 are 5 μm wide. Therefore, the sense amplifier 3-1' is reduced to about two thirds the size of the sense amplifier 3-1 of FIG. 2.

Figure 4:
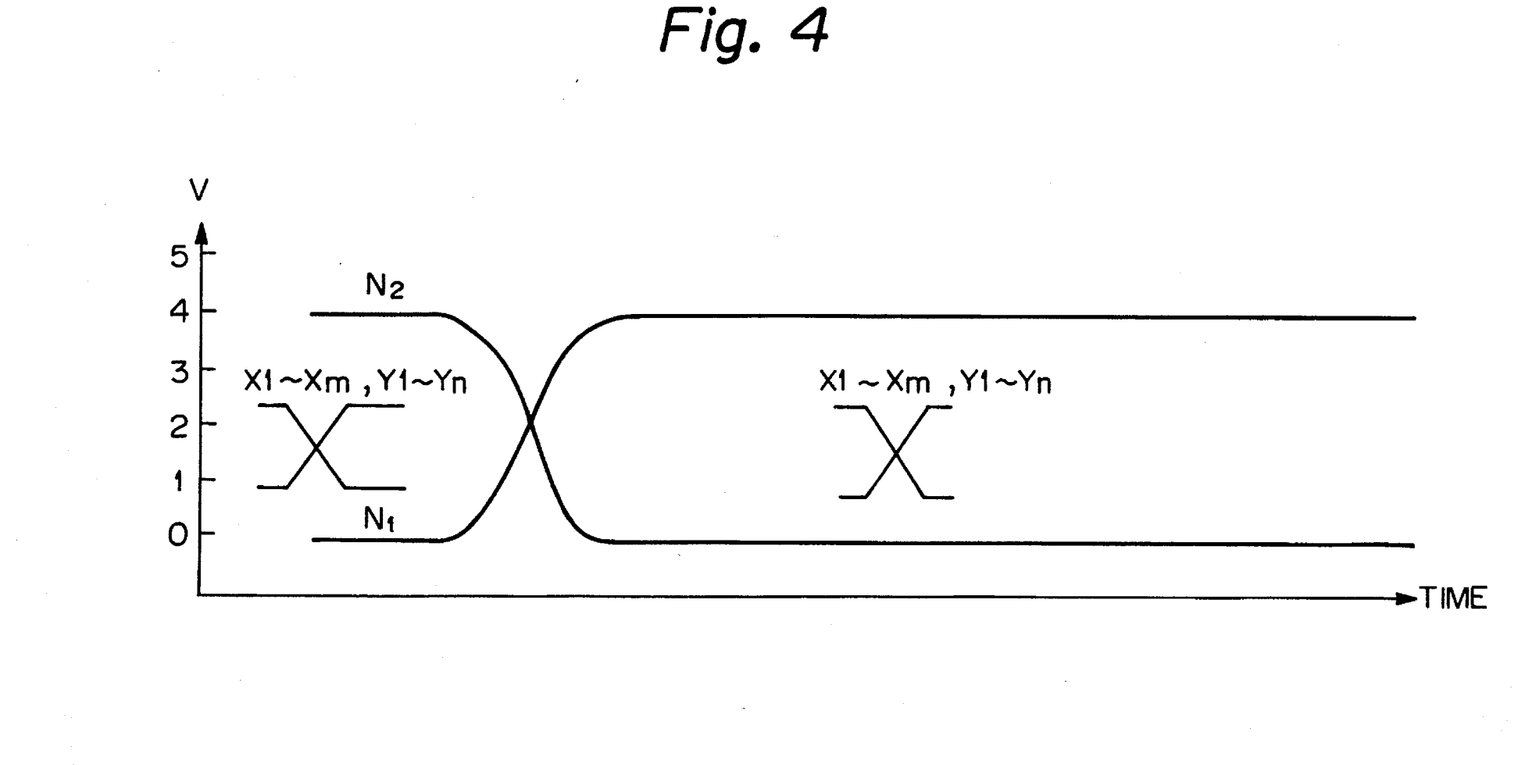
FIG. 4 is a timing diagram showing the operation of the sense amplifer of FIG. 3.

As shown in FIG. 4, when the positive feedback power is too strong, the inverting operation of the differential amplifier 313' is too slow. As a result, at worst, the inverting operation of the differential amplifier 313' may not occur.

Figure 5:
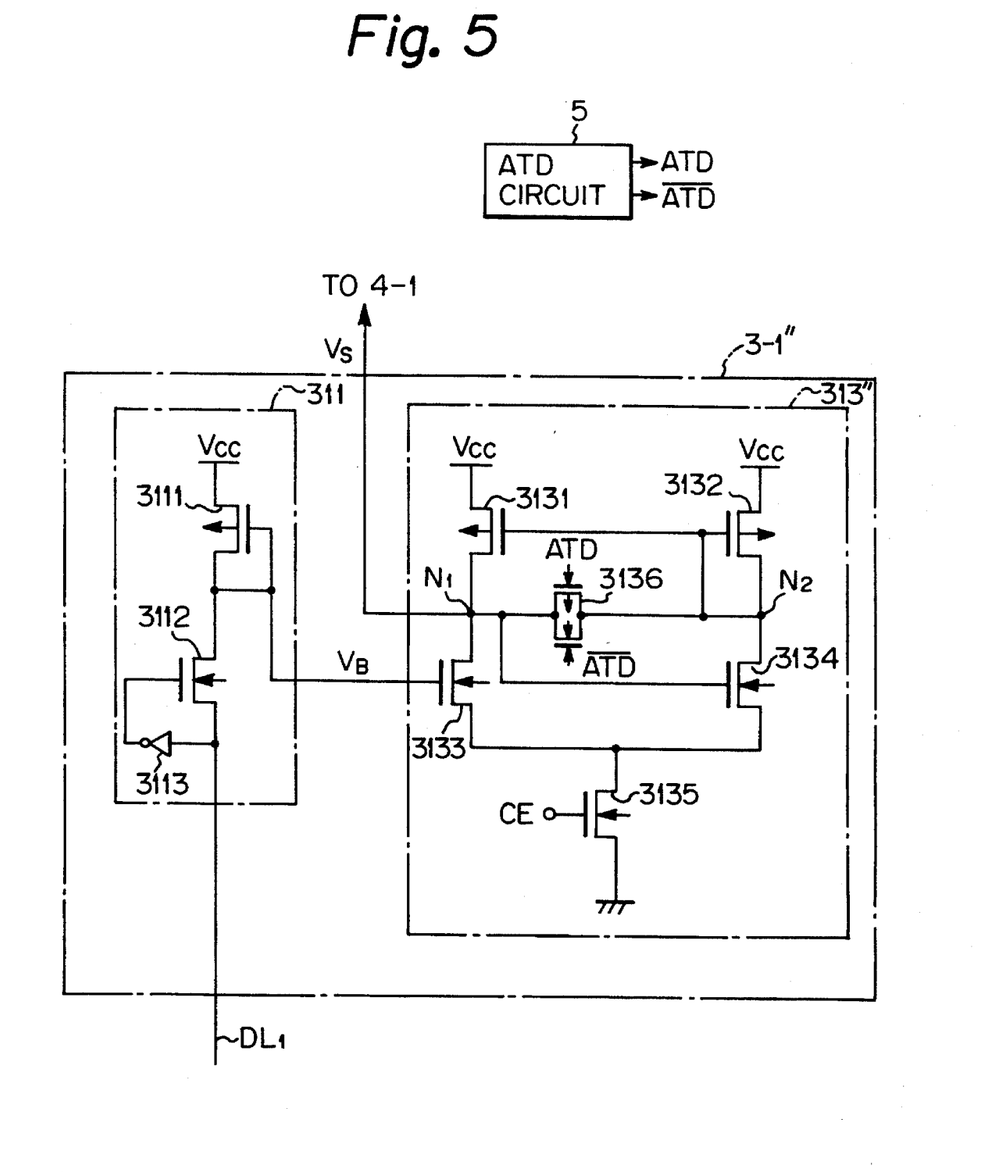
FIG. 5 is a circuit diagram illustrating a second embodiment of the sense amplifier according to the present invention.

In FIG. 5, which illustrates a second embodiment of the present invention, in a differential amplifier 313" of a sense amplifier 3-1", a potential equalizer 3136 formed by a transfer gate is connected between the nodes $N_1$ and $N_2$. For example, this transfer gate is comprised of a P-channel MOS transistor and an N-channel MOS transistor both having a 5 μm width.

The potential equalizer 3136 is operated by an address transition detection (ATD) circuit 5 for detecting a transition of at least one of the X address signals X1, ..., Xm and the Y address signals Y1, ..., Yn to generate a signal ATD and its inverted signal $\overline{ATD}$.

Figure 6:
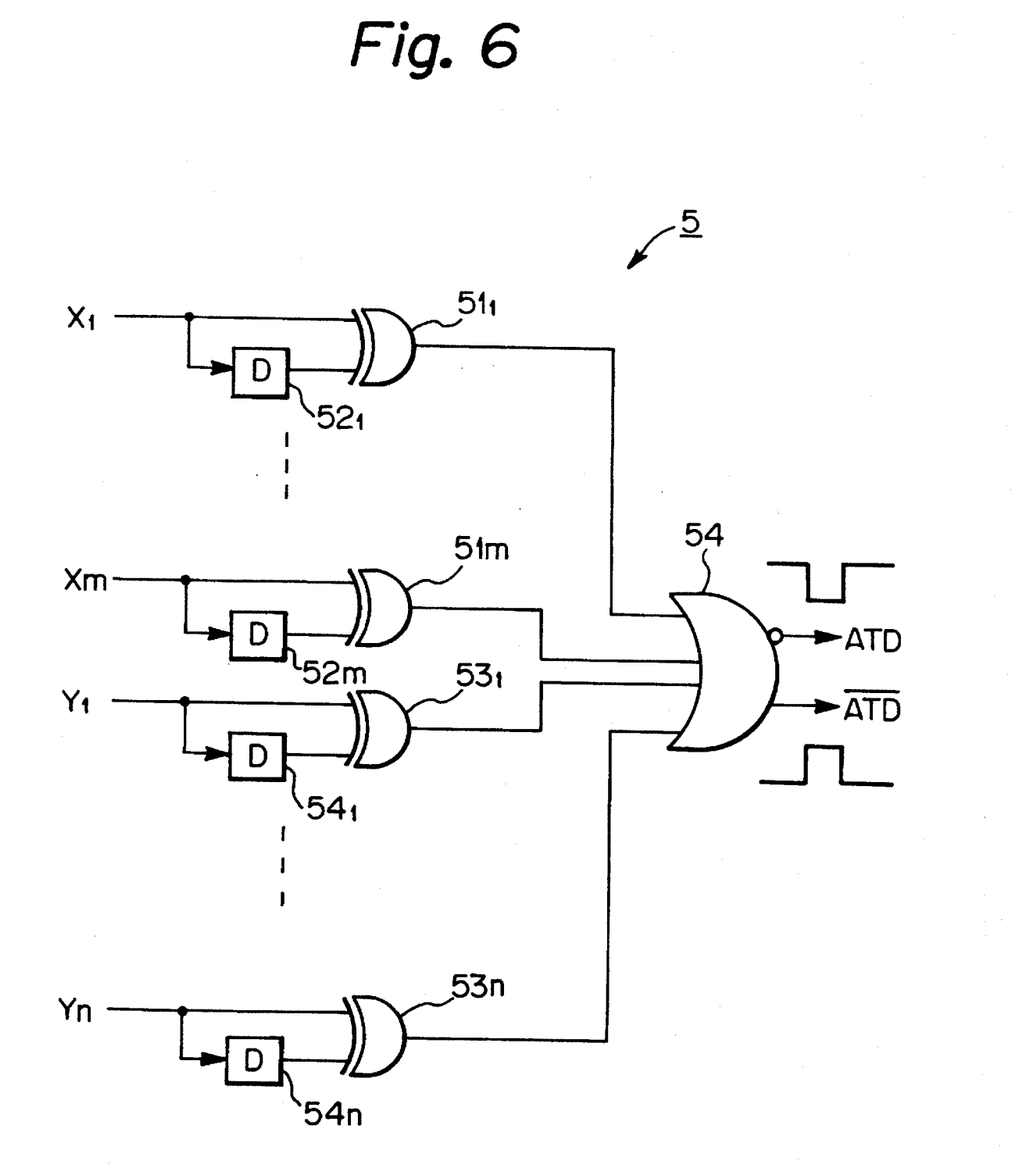
FIG. 6 is a detailed circuit diagram of the address transition detection circuit of FIG. 5.

In FIG. 6, which is a detailed circuit diagram of the address transition detection circuit 5 of FIG. 5, the address transition detection circuit 5 includes an exclusive OR circuit $51_1$ and a delay circuit $52_1$ for detecting a transition of the X address signal X1, ..., an exclusive OR circuit $51_m$ and a delay circuit $52_m$ for detecting a transition of the X address signal Xm, an exclusive OR circuit $53_1$ and a delay circuit $54_1$ for detecting a transition of the Y address signal Y1, ..., an exclusive OR circuit $53_n$ and a delay circuit $54_n$ for detecting a transition of the Y address signal Yn. The outputs of the exclusive OR circuits $51_1, ..., 51_m, 53_1, ..., 53_n$ are supplied to an OR circuit 54 having an inverted output terminal for generating the signal ATD and a non-inverted output terminal for generating the signal $\overline{ATD}$. That is, when at least one of the address signals X1, ..., Xm, Y1, ..., Yn is changed, the corresponding exclusive OR circuit generates a pulse signal having a pulse width determined by the delay circuit $52_1, ..., 52_m, 53_1, ..., $ or $53_n$, and as a result, the OR circuit 54 generates the pulse signals ATD and $\overline{ATD}$.

Figure 7:
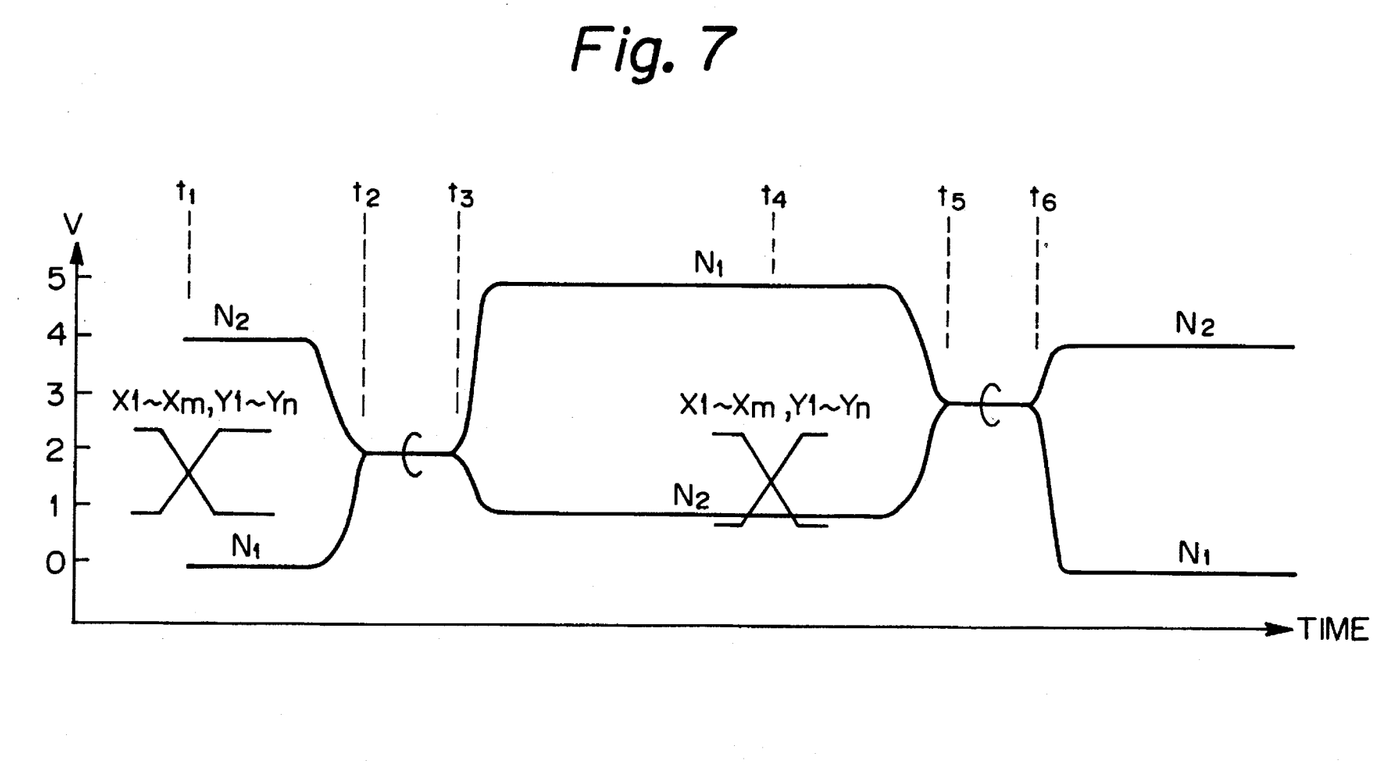
FIG. 7 is a timing diagram showing the operation of the sense amplifier of FIG. 5.

The operation of the sense amplifier 3-1' of FIG. 5 is explained next with reference to FIG. 7. That is, when at least one of the address signals X1 to Xm and Y1 to Yn is changed at time $t_1$ or $t_4$, the potential equalizer 3136 is turned ON at time $t_2$ or $t_5$, so that the voltage at the node $N_1$ is equal to that at the node $N_2$. Then, at time $t_3$ or $t_6$, the voltage at the node $N_1$ is changed in response to the output voltage $V_B$ of the bias circuit 311, and accordingly, the voltage at the node $N_2$ is changed inversely in response to the voltage at the node $N_1$.

Thus, in the second embodiment, the inverting operation of the differential amplifier 313" can be surely carried out due to the presence of the potential equalizer 3136.

Figure 8:
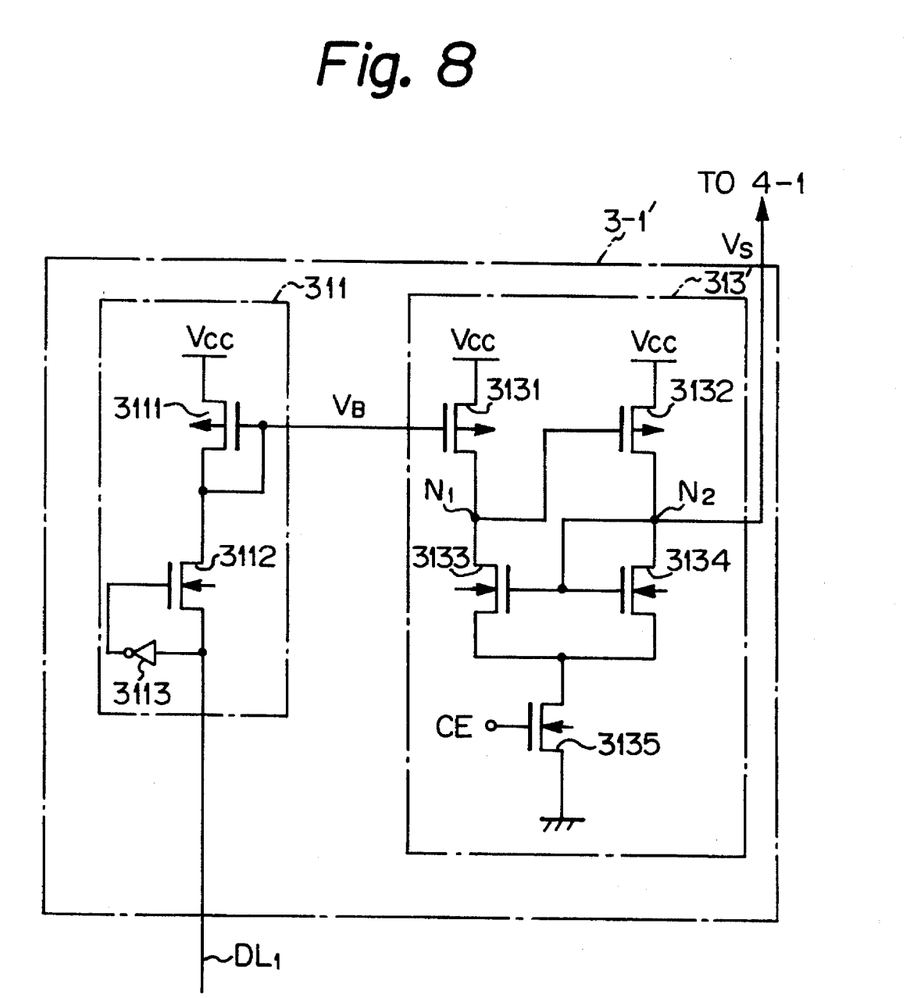
FIGS. 8 and 9 are circuit diagrams illustrating modifications of the sense amplifiers of FIGS. 3 and 5, respectively.

The sense amplifier 3-1' of FIG. 3 can be modified to a sense amplifier as illustrated in FIG. 8. In FIG. 8, the N-channel transistors 3133 and 3134 form a current mirror circuit. In this case, the output voltage $V_B$ of the bias circuit 311 is supplied to the gate of the P-channel transistor 3131, and the gate of the P-channel transistor 3132 is connected to the node $N_1$ to realize a positive feedback loop. The operation of the sense amplifier of FIG. 8 is similar to that of FIG. 3.

Figure 9:
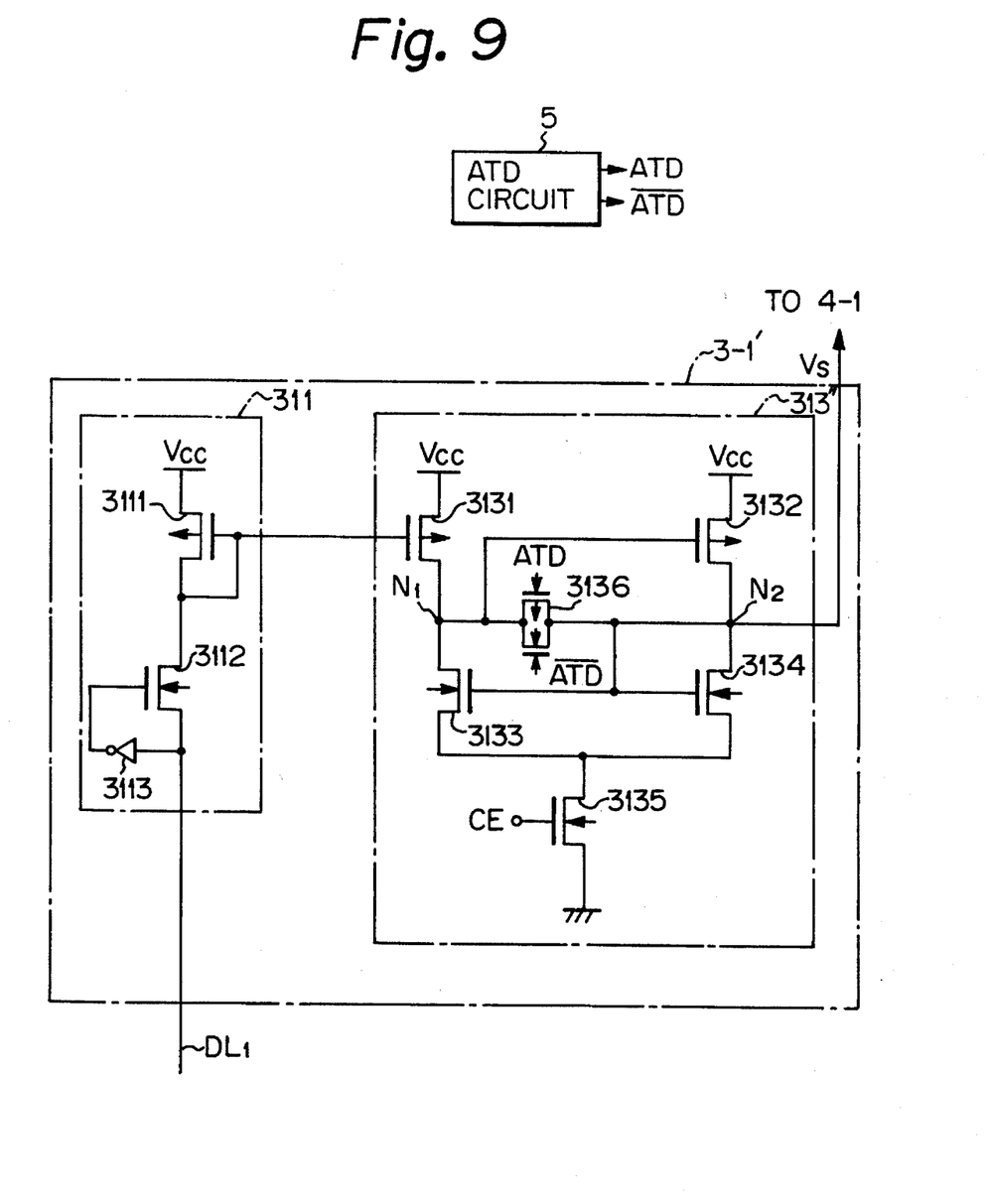

Similarly, the sense amplifier 3-1" of FIG. 5 can be modified to a sense amplifier as illustrated in FIG. 9. In FIG. 9 the N-channel transistors 3133 and 3134 form a current mirror circuit. In this case, the output voltage $V_B$ of the bias circuit 311 is supplied to the gate of the P-channel transistor 3131, and the gate of the P-channel transistor 3132 is connected to the node $N_1$ to realize a positive feedback loop. The operation of the sense amplifier of FIG. 9 is similar to that of FIG. 5.

Figure 10A:
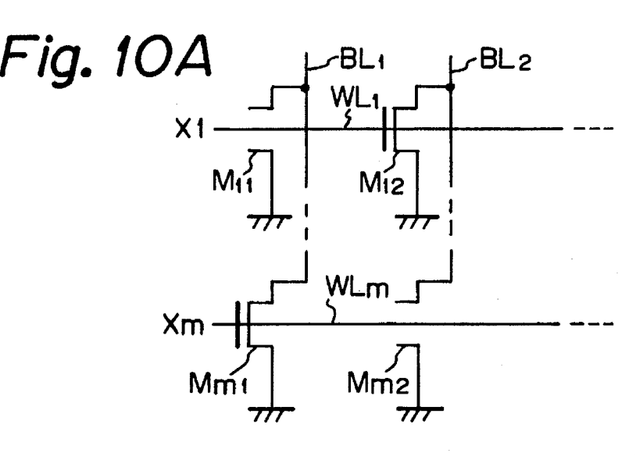
FIGS. 10A, 10B, 10C and 10D are circuit diagrams of modifications of the memory cell array of FIG. 2.
Figure 10B:
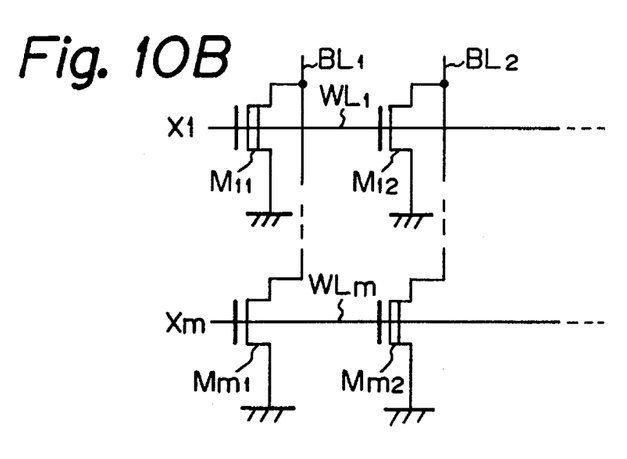
Figure 10C:
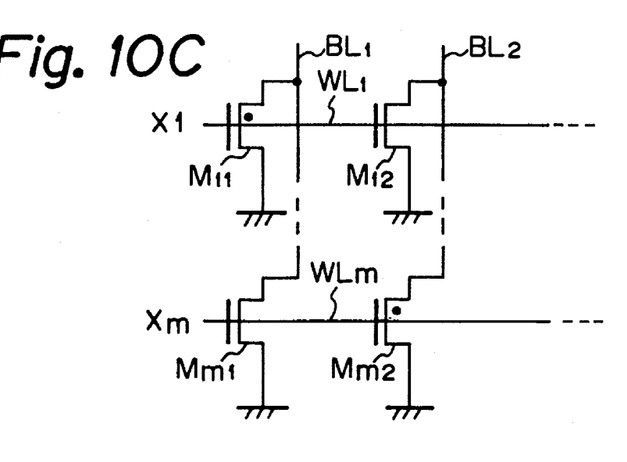
Figure 10D:
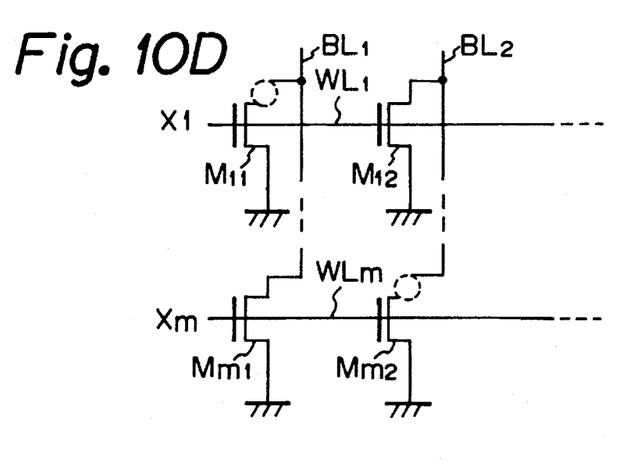

In FIG. 2, the memory cell array 1-1 can be constructed by mask ROM cells. For example, as illustrated in FIG. 10A, data "0" or "1" of a memory cell corresponds to the presense or absense of an enhancement type transistor. Also, as illustrated in FIG. 10B, data "0" or "1" corresponds to the low or high threshold voltage of a transistor. Further, as illustrated in FIG. 10C, data "0" or "1" corresponds to the depletion type or enhancement type of a transistor. Further, as illustrated in FIG. 10D, data "0" or "1" corresponds to the presense or absense of a contact window (throughhole) which connects a transistor to one bit line.

As explained hereinbefore, according to the present invention, since no reference voltage generating circuit is provided in a sense amplifier, the integration can be enhanced and the power dissipation can be reduced.

I claim:

1. A semiconductor memory device comprising:

a memory cell array including a plurality of read-only memory cells;

a digit line, connected to said memory cell array, for receiving read data from a selected one of said read-only memory cells;

a bias circuit, connected to said digit line, for amplifying a voltage at said digit line; and a differential amplifier having a positive phase input, a negative phase input, a positive phase output and a negative phase output, one of said positive phase input and said negative phase input being connected to an output of said bias circuit, the other of said positive phase input and said negative phase input being connected to one of said positive phase output and said negative phase output in-phase.

2. The device as set forth in claim 1, further comprising a potential equalizer connected between said positive phase output and said negative phase output of said differential amplifier.

3. The device as set forth in claim 2, wherein said potential equalizer equalizes potentials at said positive phase output and said negative phase output of said differential amplifier with each other when an address supplied to said device is changed.

4. The device as set forth in claim 1, wherein said differential amplifier comprises:

a first power supply terminal;

a second power supply terminal having a lower potential than said first power supply terminal;

a first P-channel MOS transistor having a source connected to said first power supply terminal, a gate and a drain;

a second P-channel MOS transistor having a source connected to said first power supply terminal, a gate connected to the gate of said first P-channel MOS transistor, and a drain connected to the gates of said first and second P-channel MOS transistors;

a first N-channel MOS transistor having a source connected operatively to said second power supply terminal, a gate connected to the output of said bias circuit and a drain connected to the drain of said first P-channel MOS transistor;

a second N-channel MOS transistor having a source connected operatively to said second power supply terminal, a gate connected to the drain of said first P-channel MOS transistor, and a drain connected to the drain of said second P-channel MOS transistors.

5. The device as set forth in claim 1, wherein said differential amplifier comprises:

a first power supply terminal;

a second power supply terminal having a lower potential than said first power supply terminal;

a first P-channel MOS transistor having a source connected to said first power supply terminal, a gate connected to the output of said bias circuit and a drain;

a second P-channel MOS transistor having a source connected to said first power supply terminal, a gate connected to the drain of said first P-channel MOS transistor, and a drain;

a first N-channel MOS transistor having a source connected operatively to said second power supply terminal, a gate connected to the drain of said second P-channel MOS transistor and a drain connected to the drain of said first P-channel MOS transistor; and a second N-channel MOS transistor having a source connected operatively to said second power supply terminal, a gate connected to the gate of said first N-channel MOS transistor, and a drain connected to the drain of said second P-channel MOS transistor.

6. The device as set forth in claim 2, wherein said differential amplifier comprises:

a first power supply terminal;

a second power supply terminal having a lower potential than said first power supply terminal;

a first P-channel MOS transistor having a source connected to said first power supply terminal, a gate and a drain connected to a first terminal of said potential equalizer;

a second P-channel MOS transistor having a source connected to said first power supply terminal, a gate connected to the gate of said first P-channel MOS transistor, and a drain connected to the gate of second P-channel MOS transistor and a second terminal of said potential equalizer;

a first N-channel MOS transistor having a source connected operatively to said second power supply terminal, a gate connected to the output of said bias circuit and a drain connected to the drain of said first P-channel MOS transistor;

a second N-channel MOS transistor having a source connected operatively to said second power supply terminal, a gate connected to the drain of said first P-channel MOS transistor, and a drain connected to the drain of said second P-channel MOS transistor.

7. The device as set forth in claim 2, wherein said differential amplifier comprises:

a first power supply terminal;

a second power supply terminal having a lower potential than said first power supply terminal;

a first P-channel MOS transistor having a source connected to said first power supply terminal, a gate connected to the output of said bias circuit and a drain connected to a first terminal of said potential equalizer;

a second P-channel MOS transistor having a source connected to said first power supply terminal, a gate connected to the drain of said first P-channel MOS transistor, and a drain connected to a second terminal of said potential equalizer;

a first N-channel MOS transistor having a source connected operatively to said second power supply terminal, a gate connected to the drain of said second P-channel MOS transistor and a drain connected to the drain of said first P-channel MOS transistor; and a second N-channel MOS transistor having a source connected operatively to said second power supply terminal, a gate connected to the gate of said first P-channel MOS transistor, and a drain connected to the drain of said second P-channel MOS transistor.

8. A device as set forth in claim 1, wherein said read-only memory cells are of a nonvolatile type.

9. A device as set forth in claim 1, wherein said read-only memory cells are of a mask ROM cell type.

10. The device as set forth in claim 9, further comprising a potential equalizer, connected between said positive phase output and said negative phase output of said differential amplifier, for equalizing potentials at said positive phase output and said negative phase output of said differential amplifier with each other when an address supplied to said device is changed.

11. A semiconductor memory device comprising:

a memory cell array including a plurality of read-only memory cells;

a digit line, connected to said memory cell array, for receiving read data from a selected one of said read-only memory cells;

a bias circuit, connected to said digit line, for amplifying a voltage at said digit line; and a differential amplifier having a positive phase input, a negative phase input, a positive phase output and a negative phase output, said positive phase input being connected to an output of said bias circuit, said negative phase input being connected to said negative phase output.

* * * * *